(12) United States Patent
Morizumi et al.

(10) Patent No.: US 10,290,780 B2
(45) Date of Patent: May 14, 2019

(54) METHOD FOR MANUFACTURING LIGHT-EMITTING DEVICE

(71) Applicant: NICHIA CORPORATION, Anan-shi, Tokushima (JP)

(72) Inventors: Shu Morizumi, Tokushima (JP); Shinya Nakagawa, Anan (JP)

(73) Assignee: NICHIA CORPORATION, Anan-shi (JP)

( * ) Notice: Subject to any disclaimer, the term of this patent is extended or adjusted under 35 U.S.C. 154(b) by 0 days.

(21) Appl. No.: 15/636,749

(22) Filed: Jun. 29, 2017

(65) Prior Publication Data
US 2018/0006200 A1 Jan. 4, 2018

(30) Foreign Application Priority Data

Jun. 30, 2016 (JP) .................. 2016-129613

(51) Int. Cl.
| | |
|---|---|
| H01L 33/50 | (2010.01) |
| H01L 33/56 | (2010.01) |
| H01L 27/15 | (2006.01) |
| H01L 33/48 | (2010.01) |
| H01L 33/54 | (2010.01) |

(52) U.S. Cl.
CPC ............ *H01L 33/56* (2013.01); *H01L 27/153* (2013.01); *H01L 33/486* (2013.01); *H01L 33/502* (2013.01); *H01L 33/505* (2013.01); *H01L 33/507* (2013.01); *H01L 33/54* (2013.01); *H01L 2224/48091* (2013.01);

(Continued)

(58) Field of Classification Search
CPC ........... H01L 2924/00; H01L 2924/181; H01L 2924/00012; H01L 33/50
See application file for complete search history.

(56) References Cited

U.S. PATENT DOCUMENTS

| | | | | |
|---|---|---|---|---|
| 7,595,540 B2 * | 9/2009 | Fukuda | ................ | B81B 7/0077 257/431 |
| 8,318,514 B2 * | 11/2012 | Chan | .................... | H01L 33/486 438/106 |

(Continued)

FOREIGN PATENT DOCUMENTS

| | | |
|---|---|---|
| JP | 2012-069753 A | 4/2012 |
| JP | 2012-094674 A | 5/2012 |

(Continued)

*Primary Examiner* — Jaehwan Oh
(74) *Attorney, Agent, or Firm* — Global IP Counselors, LLP

(57) ABSTRACT

A method for manufacturing a light-emitting device includes: providing first and second substrates each including a plurality of packages, the packages each having a recess and a light-emitting element mounted in the recess; performing potting by supplying a resin member containing particles of a fluorescent material into the recess of each of the packages of the first substrate; spreading the resin member in the recess of each of the packages of the first substrate; measuring a height of an upper surface of the resin member spread in the recess of at least one of the packages of the first substrate; and adjusting a quantity of the resin member to be supplied into the recess of each of the packages of the second substrate depending on the measured height of the upper surface of the resin member.

5 Claims, 3 Drawing Sheets

(52) U.S. Cl.
CPC .. *H01L 2924/181* (2013.01); *H01L 2933/005* (2013.01); *H01L 2933/0041* (2013.01)

(56) References Cited

U.S. PATENT DOCUMENTS

| | | | | |
|---|---|---|---|---|
| 8,587,012 | B2* | 11/2013 | Chan | H01L 33/486 257/431 |
| 9,577,159 | B2* | 2/2017 | Konishi | B29C 48/402 |
| 2007/0018301 | A1* | 1/2007 | Fukuda | B81B 7/0077 257/686 |
| 2007/0173165 | A1* | 7/2007 | Taguchi | H01L 33/507 445/24 |
| 2010/0062552 | A1* | 3/2010 | Miyawaki | C08L 83/04 438/26 |
| 2012/0044667 | A1* | 2/2012 | Hanawa | H01L 33/46 362/97.1 |
| 2013/0043502 | A1* | 2/2013 | Koya | B29C 39/10 257/98 |
| 2013/0192061 | A1 | 8/2013 | Nonomura | |
| 2013/0210174 | A1 | 8/2013 | Nonomura | |
| 2013/0288404 | A1 | 10/2013 | Nonomura | |
| 2014/0051196 | A1 | 2/2014 | Miyawaki et al. | |
| 2014/0199790 | A1* | 7/2014 | Abe | H01L 22/24 438/7 |
| 2015/0004726 | A1* | 1/2015 | Konishi | H01L 33/501 438/27 |
| 2016/0260847 | A1 | 9/2016 | Miyawaki et al. | |

FOREIGN PATENT DOCUMENTS

| | | |
|---|---|---|
| JP | 2012-094675 A | 5/2012 |
| JP | 2012-160594 A | 8/2012 |
| JP | 2013-065644 A | 4/2013 |
| WO | 2012-147611 A1 | 11/2012 |
| WO | 2013-038611 A1 | 3/2013 |

* cited by examiner

METHOD FOR MANUFACTURING LIGHT-EMITTING DEVICE

CROSS-REFERENCE TO RELATED APPLICATIONS

The present application claims priority to Japanese Patent Application No. 2016-129613 filed on Jun. 30, 2016. The entire disclosure of Japanese Patent Application No. 2016-129613 is hereby incorporated herein by reference.

BACKGROUND OF THE INVENTION

1. Field of the Invention

The present invention relates to a method for manufacturing a light-emitting device.

2. Description of Related Art

Some known light-emitting devices such as light-emitting diode (LED) devices include semiconductor light-emitting elements (hereinafter also referred to as "light-emitting elements") and granular fluorescent materials.

In a known method for manufacturing such light-emitting devices, a liquid resin containing a fluorescent material is discharged from a dispenser nozzle attached to the tip of a syringe to perform potting (for example, see WO 2012/147611).

The viscosity of the liquid resin tends to increase in the syringe as time passes. Hence, the quantity of the liquid resin discharged from the nozzle gradually changes. If the quantity of the liquid resin changes, the chromaticity of the resulting light-emitting device also changes. For this reason, the operation is performed under an environment in which the viscosity of the liquid resin is less likely to increase.

However, it is difficult to completely prevent the increase in the viscosity of the liquid resin. The influence of the change in the viscosity can be reduced by preparing less liquid resin and using up the resin in a short time, but this method hinders mass production.

SUMMARY OF THE INVENTION

A method for manufacturing a light-emitting device according to one embodiment includes: providing a first substrate and a second substrate each including a plurality of packages, the packages each having a recess and a light-emitting element mounted in the recess; performing potting by supplying a resin member containing particles of a fluorescent material into the recess of each of the packages of the first substrate; spreading the resin member in the recess of each of the packages of the first substrate; measuring a height of an upper surface of the resin member spread in the recess of at least one of the packages of the first substrate; and adjusting a quantity of the resin member to be supplied into the recess of each of the packages of the second substrate depending on the measured height of the upper surface of the resin member spread in the recess of the at least one of the packages of the first substrate.

The above-described constitution can reduce fluctuations in chromaticity due to uneven discharge quantities caused by the change in the viscosity of a liquid resin.

DETAILED DESCRIPTION OF EMBODIMENTS

Figure 1A:
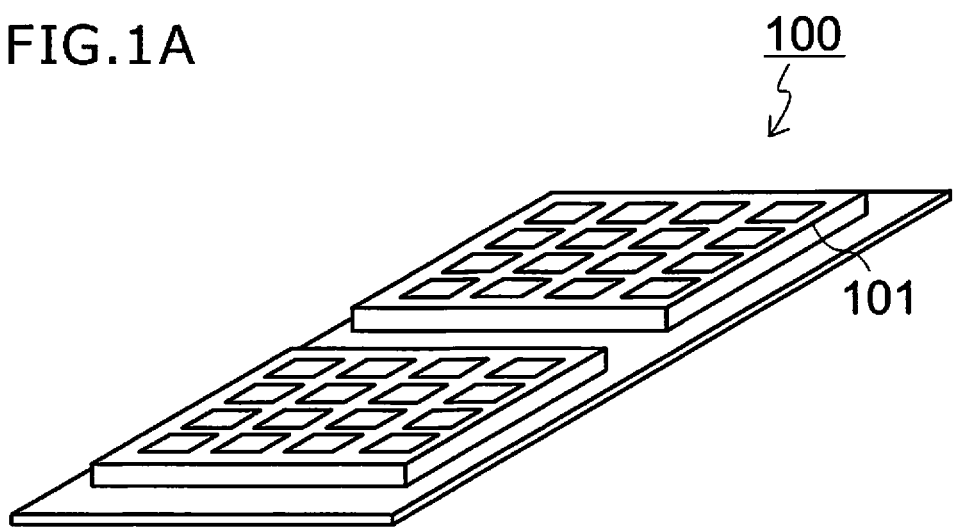
FIG. 1A is a schematic perspective view of a substrate according to an embodiment.

The following describes an embodiment of the present invention with reference to the drawings. The embodiment below exemplifies a method for manufacturing a light-emitting device embodying the technical concept of the present invention and is not intended to limit the method for manufacturing a light-emitting device of the present invention.

Also, in the specification, members disclosed in Claims are never limited to the members in the embodiment. In particular, unless specifically stated otherwise, the sizes, materials, shapes, and relative positions of constituent components described in the embodiment do not limit the scope of the present disclosure to the aforementioned descriptions only. It is noted that there is a case where magnitudes or positional relations of members illustrated in each drawing are exaggerated in order to clarify the descriptions. Furthermore, in the descriptions below, the same term or reference numeral represents the same member or a member made of the same material, and its detailed description will be omitted as appropriate. Also, in the manufacturing procedure, a package, which includes electrically-conductive members and a supporting member, and a light-emitting device including the package are respectively described using a package assemblage and a light-emitting device assemblage. The same term may be used in descriptions before and after singulation of each assemblage.

<Providing Substrate Including Light-Emitting Elements Thereon>

A plurality of substrates including light-emitting elements thereon are provided. The substrates have the same shape. Among the provided substrates, one substrate on which potting is performed earlier is referred to as a first substrate, and a substrate on which potting is performed on the basis of feedback about the first substrate is referred to as a second substrate. When potting is performed on the second substrate, it is newly referred to as a first substrate, and a substrate on which potting is performed afterward becomes a new second substrate. Potting is sequentially performed in this way, and the names of the substrates sequentially change accordingly. The substrates are simply referred to as "substrates" in descriptions common to the first substrate and the second substrate.

Figure 1B:
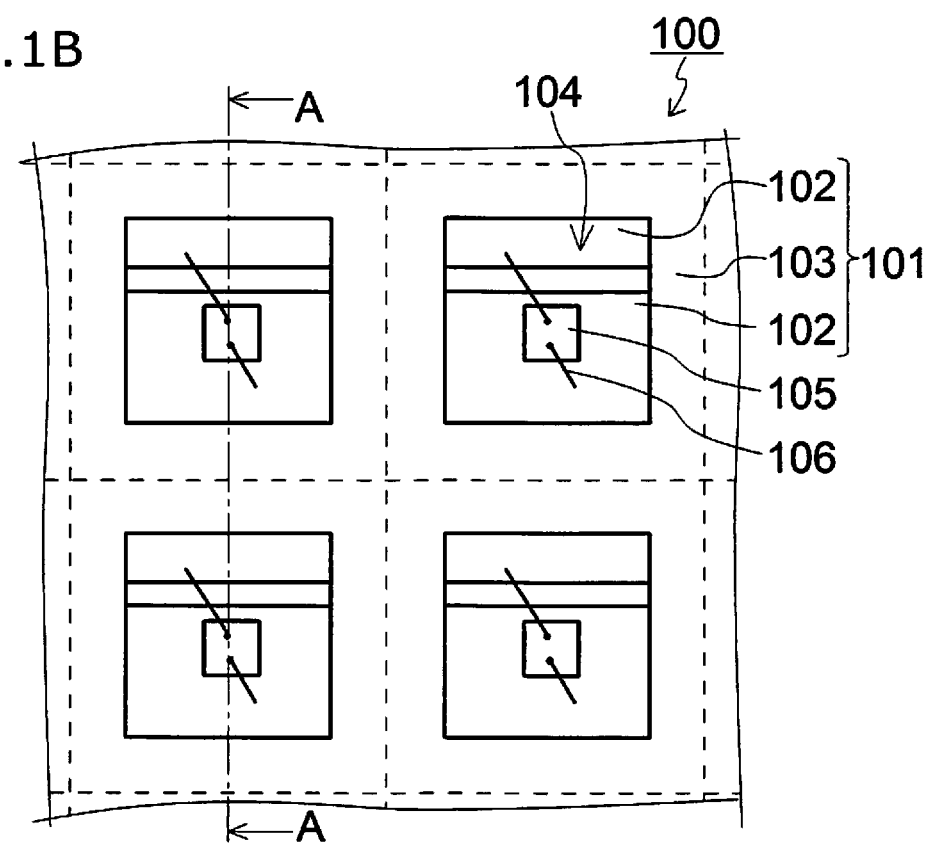
FIG. 1B is a schematic, partial, enlarged top view of FIG. 1A.
Figure 1C:
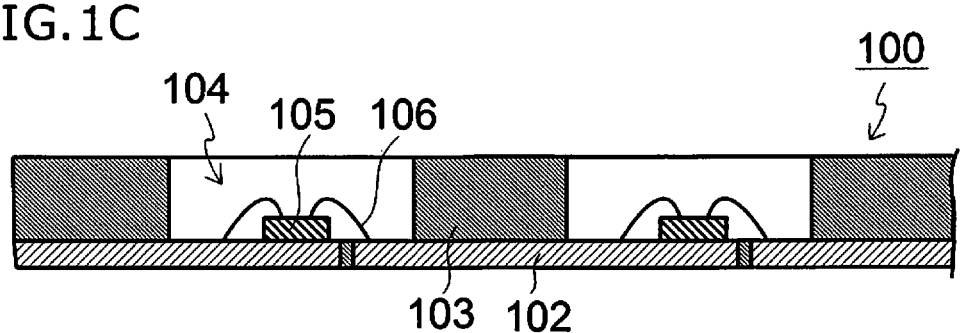
FIG. 1C is a schematic sectional view taken along the line A-A in FIG. 1B.

As shown in FIG. 1A, FIG. 1B, and FIG. 1C, a substrate 100 includes a plurality of packages 101 each including an insulating supporting member 103 and electrically-conductive members 102. The substrate 100 shown here includes package assemblages in each of which the packages 101 are formed integrally. One or more package assemblages may be disposed on one lead frame. A substrate including two package assemblages on one lead frame is illustrated here. Instead of providing the package assemblages shown in FIG. 1A, the packages 101 may each be formed apart from adjacent packages in advance.

The dashed lines in FIG. 1B represent illustrative lines along which the package assemblages are to be cut, and a portion enclosed by the dashed lines is one package 101. Cutting is finally performed along these cutting lines to provide light-emitting devices.

The packages 101 each have a recess 104, and a plurality of recesses 104 are aligned in a plurality of columns and a plurality of rows. A pair of electrically-conductive members (leads) 102 are exposed on the bottom surface of each recess 104. At least one light-emitting element 105 is disposed in one recess 104. Each light-emitting element 105 is mounted with a bonding member. Each light-emitting element 105 is electrically connected to (face-up mounted on) the leads 102 with wires 106. The light-emitting element 105 may be mounted (flip-chip mounted) on the leads 102 not with the wires 106 but with electrically-conductive bonding members. In addition to the light-emitting element, a protective element such as a Zener diode can be disposed in the recess 104.

<Performing Potting by Supplying Resin Member Containing Particles of Fluorescent Material>

Figure 2A:
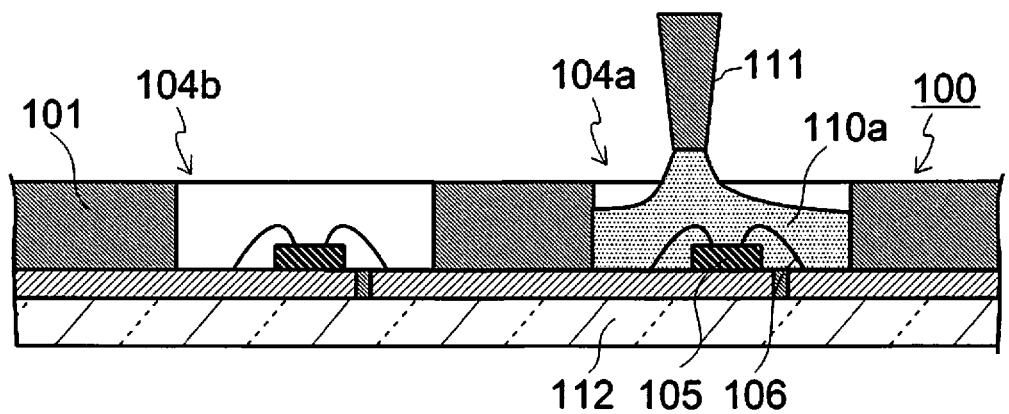
FIG. 2A is a schematic sectional view for illustrating a method for manufacturing a light-emitting device according to the embodiment.

FIG. 2A is a schematic sectional view of the substrate 100 shown in FIG. 1A disposed on a table 112 of a potting machine. The potting machine includes the table 112 on which the substrate is disposed, and a syringe above the table. The table 112 has an upper flat surface that can support the substrate 100. The table 112 is provided with a mechanism that can mount the substrate at a predetermined position on the table 112. One or more syringes can be provided. A dispenser nozzle 111 is attached to the lower end of the syringe. A preparation tank in which a resin member (liquid resin) containing a resin and a fluorescent material is prepared is connected via a plurality of syringes and tubes. The liquid resin in the preparation tank is transferred into each syringe as appropriate via the tubes. Increasing pressure in the syringes makes a resin member 110 be discharged from the tip of the dispenser nozzle 111 as shown in FIG. 2A.

Here, the case of two recesses 104a and 104b shown in FIG. 2A is described as an example. First, a resin member 110a is supplied from the dispenser nozzle 111 into the recess 104a. The supplied resin member 110a encases the light-emitting element 105 and the wires 106 disposed in the recess 104a.

Figure 2B:
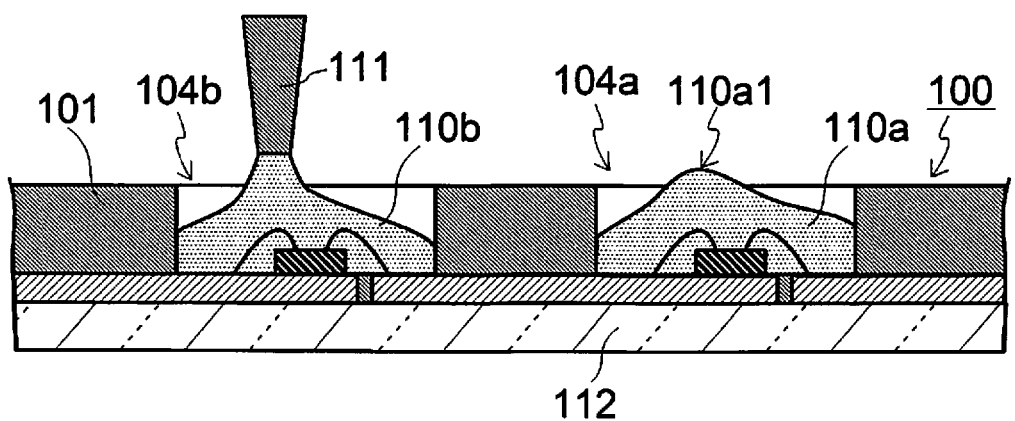
FIG. 2B is a schematic view for illustrating the method for manufacturing the light-emitting device according to the embodiment.

Next, the dispenser nozzle 111 is disposed above the recess 104b as shown in FIG. 2B, and a resin member 110b is then supplied into the recess 104b. In this manner, the dispenser nozzle or the substrate is moved sequentially and then the resin member is discharged into the recess, in the case where the number of dispenser nozzles is smaller than the number of recesses in the substrate.

Figure 2C:
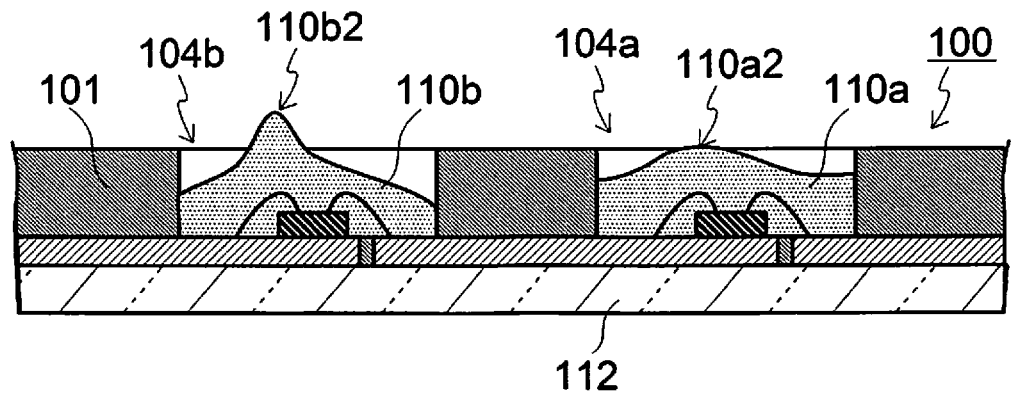
FIG. 2C is a schematic view for illustrating the method for manufacturing the light-emitting device according to the embodiment.

The liquid resin supplied into each recess spreads within the recess. For example, regarding the resin member 110a supplied into the recess 104a, the highest portion of an upper surface 110a2 of the resin member 110a shown in FIG. 2C is lower than the highest portion of an upper surface 110a1 of the resin member 110a shown in FIG. 2B. As described above, the resin member 110a gradually spreads as time passes after being supplied, and the height of its upper surface changes. In FIG. 2C, the resin member 110a in the recess 104a differs in the height of the upper surface and the degree of the spread from the resin member 110b in the recess 104b formed afterward.

<Spreading Resin Member>

Next, the resin member supplied into the recess is spread within the recess. For example, allowing the resin member to stand still for one to five minutes at room temperature enables the liquid member to fully spread in the recess.

Figure 2D:
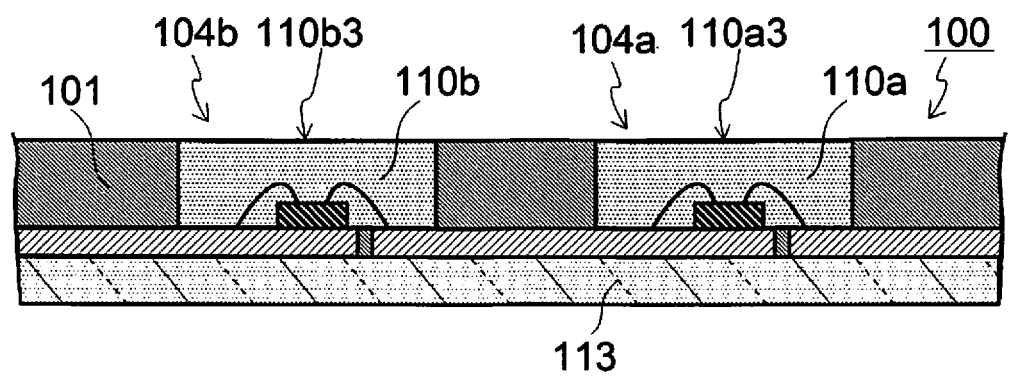
FIG. 2D is a schematic view for illustrating the method for manufacturing the light-emitting device according to the embodiment.

Alternatively, the substrate with the resin members is transferred from the table 112 onto a heater 113. The heater 113 to be used can, for example, have an upper surface on which the substrate can be disposed like the above-described table 112 and include an electric heating bar inside. The upper surface of the heater 113 is preferably flat so that substantially the entire back surface of the substrate disposed is uniformly heated. The temperature of the heater and the time period during which the substrate is disposed can be electronically controlled. The heating temperature of the heater 113 is set to, for example, about 30° C. to 50° C., and the substrate 100 is disposed on the heater 113 at a temperature within the above-described range. The time period can be, for example, 60 to 90 seconds. This heating can lower the viscosity of the resin members in the recesses as shown in FIG. 2D. The resin members can then fully spread within the recesses.

<Measuring Height of Upper Surface of Spread Resin Member>

Figure 3:
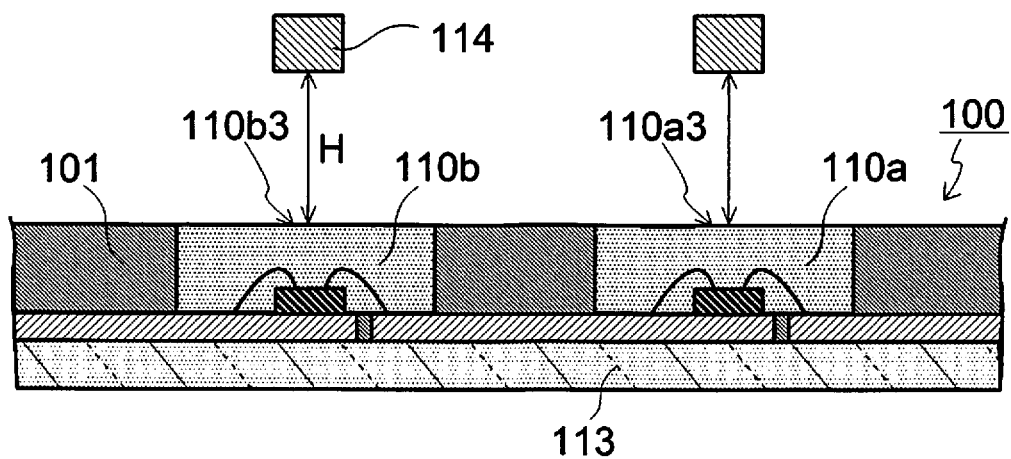
FIG. 3 is a schematic view for illustrating the method for manufacturing the light-emitting device according to the embodiment.

Subsequently, as shown in FIG. 3, the heights of the upper surfaces 110a3 and 110b3 of the resin members 110a and 110b are measured with cameras 114 disposed above the recesses. The quantity of the resin member in each recess can be calculated on the basis of the measured height of the resin member and pieces of information such as the height and volume of the recess and volumes of the light-emitting element and the wires mounted in the recess.

<Adjusting Quantity of Resin Member to be Supplied>

The quantity of the resin member to be supplied to the succeeding second substrate is adjusted (feedback is performed) in accordance with the quantity of the resin member in the first substrate calculated in the above-described manner. That is, in the case where the measured quantity of the resin member is smaller than a reference quantity of the resin member, increasing the pressure applied to the syringes can increase the quantity of the liquid resin discharged from the dispenser nozzle. When the viscosity of the liquid resin becomes higher, the quantity of the liquid resin to be discharged decreases under the same pressure. Quick feedback enables quick adjustment of the discharge quantity of the liquid resin. Hence, unevenness in discharge quantities can be reduced, and fluctuations in chromaticity can be suppressed.

To perform quick feedback, quick measurement of the height of the resin member in the recess is necessitated. Hence, particularly in the case of a resin member that is difficult to spread, its viscosity is first lowered to spread the resin member within the recess by performing a step such as heating, and the height is then measured, thereby achieving quick feedback.

For example, in the case where the waiting time is set long to fully spread the resin member, then, the height of the resin member is measured, and information of the height is fed back, the substrate disposed four or five substrates after the first substrate measured is used as the second substrate, and the discharge quantity in forming the resin members in the second substrate is adjusted. In the case where the resin member is forcibly spread by heating, then, the height of the resin member is measured, and information of the height is fed back, the substrate disposed one or two substrates after the first substrate measured is used as the second substrate, and the discharge quantity in forming the resin members in the second substrate can be adjusted.

<Substrate>

The substrate includes a plurality of packages each having the recess. In other words, the substrate is a package assemblage. One package may have one or more recesses. The bottom surface of the recess has at least two electrically-conductive members that serve as a pair of positive and negative electrodes. The pair of electrically-conductive members are integrally held by the insulating supporting member.

The package can be a resin package including leads as the electrically-conductive members and a resin member as the supporting member. Alternatively, the package can be a ceramic package including a ceramic as the supporting member and wiring members as the electrically-conductive members. Alternatively, the package can be a glass epoxy package including glass epoxy as the supporting member and wiring members as the electrically-conductive members. In a package including such a supporting member, the recess is defined by the supporting member and the electrically-conductive members. Alternatively, the package can be a chip-on-board (COB) package in which a frame is formed by drawing, laminating, shaping, or the like on a substrate including the electrically-conductive members on the upper surface of the supporting member made of metal, ceramic, or the like. In the COB package, the recess is defined by the frame and the substrate including the supporting member and the electrically-conductive members.

A substrate without the supporting member is possible. That is, a substrate in which one of the pair of electrically-conductive members has the recess can be used.

Known materials can be used for the above-described resin package, ceramic package, glass epoxy package, and COB package. The shape, size, depth, and the like of the recess can be selected from various values depending on the purpose and the intended use.

The light-emitting element includes a semiconductor layer, which includes a light-emitting layer, that is layered on an element substrate. A p-layer, the light-emitting layer, and an n-layer constituting the semiconductor layer are not particularly limited, and, for example, a nitride compound semiconductor such as $In_XAl_YGa_{1-X-Y}N$ ($0 \leq X$, $0 \leq Y$, $X+Y \leq 1$) is suitably used. Each of these nitride semiconductor layers may have a single-layer structure, a layered structure of layers having different compositions or thicknesses, or a superlattice structure. In particular, the light-emitting layer preferably has a single quantum well or multiple quantum well structure in which thin films that produce quantum effects are layered.

A pair of electrodes of the light-emitting element are disposed on the same side of the semiconductor layer. The pair of electrodes each may have a single-layer structure or a layered structure as long as the electrodes respectively have ohmic contact with the above-described semiconductor layers so that the respective current-voltage characteristics are linear or substantially linear. Such electrodes can be formed of a material and structure known in the field of the invention with any thickness. For example, in the case of face-up mounting, the thickness of each electrode can be ten-odd to some hundreds of nanometers. In the case of flip-chip mounting, the thickness of each electrode can be some micrometers to 300 micrometers.

<Resin Member>

The resin member includes a light-transmissive resin and particles of a fluorescent material. The resin member protects electronic components mounted on the package, such as the light-emitting element, the protective element, and the wires, against dust, water, external force, and the like. A material that can transmit light from the light-emitting element and has light resistance so that the material is less deteriorated by the light is preferable as the material of the resin member.

Preferably, the viscosity of the light-transmissive resin is lowered by heating. Examples of the resin include a resin having a viscosity of 30 to 40 Pa·s at room temperature and a reduced viscosity of 5 to 15 Pa·s when heated. Specific examples of the material of the light-transmissive resin include insulating resin compositions that can transmit light from the light-emitting element, such as silicone resin compositions, modified silicone resin compositions, epoxy resin compositions, modified epoxy resin compositions, and acrylic resin compositions. Silicone resins, epoxy resins, urea resin, fluorocarbon resins, and hybrid resins containing at least one of these resins can also be used.

The fluorescent material is granular. The fluorescent material is not limited to particular shapes but preferably has, for example, a spherical or nearly spherical shape. The fluorescent material is particles having an average grain diameter of, for example, about 3 µm to 30 µm. The average grain diameter can be defined by $D_{50}$. The average grain diameter of the fluorescent material can be measured by a method such as the laser diffraction/scattering method and image analysis (with a scanning electron microscope (SEM) or a transmission electron microscope (TEM)). As a grain-diameter measuring apparatus employing the laser diffraction/scattering method, for example, the SALD series (such as SALD-3100) manufactured by Shimadzu Corporation can be used. The image analysis is in conformity with, for example, JIS Z 8827-1:2008.

Examples of the fluorescent material include oxide-based, sulfide-based, and nitride-based fluorescent materials. For example, in the case where a gallium nitride light-emitting element that emits blue light is used as the light-emitting element, examples of the fluorescent material include YAG and LAG fluorescent materials that absorb blue light and emit yellow to green light, SiAlON (β-SiAlON) and SGS fluorescent materials that emit green light, BAM fluorescent materials that emit blue light, SCASN and CASN fluorescent materials that emit red light, manganese-activated potassium fluorosilicate (KSF fluorescent materials, $K_2SiF_6$:Mn), and sulfide fluorescent materials. These fluorescent materials may be used singly or in combination.

The resin member contains, for example, 1 part by weight to 200 parts by weight of the fluorescent material. In addition to such a material, colorants, light-diffusing agents, light-reflecting materials, and various fillers can be contained as requested. The quantity of the resin member charged is not limited as long as the quantity is large enough to cover the above-described electronic components.

The method for manufacturing a light-emitting device according to the present disclosure can be applied to various light-emitting devices such as light sources for lighting apparatuses, various indicators, vehicles, displays, backlights for liquid crystal screens, sensors, and signals.

The invention claimed is:

1. A method for manufacturing a light-emitting device, the method comprising:
    providing a first substrate and a second substrate each including a plurality of packages, the packages each having a recess and a light-emitting element mounted in the recess;
    performing potting by supplying a resin member containing particles of a fluorescent material into the recess of each of the packages of the first substrate;
    heating the resin member at a temperature of about 30° C. to 50° C. to lower a viscosity of the resin member so that the resin member spreads in the recess of each of the packages of the first substrate;

measuring a height of an upper surface of the resin member spread in the recess of at least one of the packages of the first substrate; and adjusting a quantity of the resin member to be supplied into the recess of each of the packages of the second substrate depending on the measured height of the upper surface of the resin member spread in the recess of the at least one of the packages of the first substrate.

2. The method for manufacturing a light-emitting device according to claim 1, wherein the resin member includes a silicone resin composition.

3. The method for manufacturing a light-emitting device according to claim 1, wherein the resin member includes 1 part by weight to 200 parts by weight of the fluorescent material.

4. The method for manufacturing a light-emitting device according to claim 1, wherein the measuring of the height of the upper surface of the resin member being performed by using a measuring part disposed above the recess.

5. The method for manufacturing a light-emitting device according to claim 4, wherein the measuring of the height of the upper surface of the resin member includes measuring a distance between the upper surface of the resin member and the measuring part as the height of the upper surface of the resin member.

* * * * *